United States Patent
Aihara et al.

(10) Patent No.: US 8,361,271 B2
(45) Date of Patent: Jan. 29, 2013

(54) CERAMIC-METAL BONDED BODY AND METHOD OF PRODUCING THE SAME

(75) Inventors: Yasufumi Aihara, Nagoya (JP); Hiroya Sugimoto, Chiryu (JP); Shunsuke Tanaka, Handa (JP); Kazuma Ohba, Handa (JP); Jyunya Waki, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/213,542

(22) Filed: Aug. 19, 2011

(65) Prior Publication Data

US 2012/0028057 A1  Feb. 2, 2012

Related U.S. Application Data

(63) Continuation of application No. PCT/JP2010/052557, filed on Feb. 19, 2010.

(60) Provisional application No. 61/154,000, filed on Feb. 20, 2009.

(51) Int. Cl.
*B32B 37/00* (2006.01)
*B29C 65/00* (2006.01)

(52) U.S. Cl. .................. 156/309.9; 156/285; 156/306.6; 156/308.2

(58) Field of Classification Search .................. 156/281, 156/285, 286, 306.6, 309.9, 320, 322, 246, 156/308.2, 329, 331.8
See application file for complete search history.

(56) References Cited

U.S. PATENT DOCUMENTS

| 5,935,372 A * | 8/1999 | Rojstaczer et al. ............ 156/329 |
| 7,048,823 B2 * | 5/2006 | Bermel ......................... 156/247 |
| 2002/0139473 A1 * | 10/2002 | Fujii et al. ..................... 156/330.9 |
| 2009/0040681 A1 | 2/2009 | Fujisawa et al. |

FOREIGN PATENT DOCUMENTS

| JP | 04-287344 A1 | 10/1992 |
| JP | 2002-329970 A1 | 11/2002 |
| JP | 2008-218978 A1 | 9/2008 |
| JP | 2010-040644 A1 | 2/2010 |
| WO | 2007/066572 A2 | 6/2007 |

* cited by examiner

*Primary Examiner* — John Goff
(74) *Attorney, Agent, or Firm* — Burr & Brown

(57) ABSTRACT

To form an electrostatic chuck, a bonding sheet is applied onto the upper surface of a cooling plate and then the cooling plate is placed in a vacuum dryer at a pressure of 2,000 Pa or less for a pre-bake treatment at 120° C. to 130° C. for 15 to 40 hours, followed by natural cooling. A plate is then stacked on the bonding sheet so that the lower surface of the plate is aligned with the upper surface of the bonding sheet, which is applied onto the cooling plate. The resulting stacked body is placed in a heat-resistant resin bag, and is then placed in an autoclave and treated together for several hours under pressure and heat.

11 Claims, 8 Drawing Sheets

CERAMIC-METAL BONDED BODY AND METHOD OF PRODUCING THE SAME

CROSS-REFERENCE TO RELATED APPLICATIONS

This is a continuation of the International Application No. PCT/JP2010/052557 filed on Feb. 19, 2010.

BACKGROUND OF THE INVENTION

1. Field of the Invention

The present invention relates to a ceramic-metal bonded body and a method of producing the same.

2. Description of the Related Art

An electrostatic chuck is a component used in an etching step which is one step of semiconductor manufacturing processing. More specifically, an electrostatic chuck is a component used for performing a uniform etching process on a silicon wafer by applying suction to the silicon wafer through a Johnsen-Rahbek force or a Coulomb force in a vacuum and uniformly cooling heat generated in etching. Examples of functions necessary for this component include (1) a vacuum holding power, (2) a responsiveness of applying suction to and releasing a silicon wafer, (3) a property for making the temperature of the entire surface of the silicon wafer subjected to suction uniform, and (4) corrosion resistance against chemicals used in etching. A known example of such an electrostatic chuck is an electrostatic chuck in which a ceramic plate is bonded to a supporting base composed of a metal such as aluminum with a bonding material composed of a silicone resin therebetween (for example PTL 1).

Citation List

PTL 1: JP 4-287344 A

SUMMARY OF THE INVENTION

However, when the existing electrostatic chuck is used at a high temperature of 80° C. or higher, gas is generated from the bonding material, and thus bubbles are formed between the plate and the bonding material and between the supporting base and the bonding material. These bubbles may decrease the contact area between the plate and the supporting base and cause variations in the bonding performance, thereby decreasing the temperature uniformity of a wafer subjected to suction. Furthermore, in the case where a heater is buried in the plate so as to control the temperature of the wafer to be constant, the temperature control may become difficult because the amount of heat transfer is changed by the generation of such bubbles. These problems also occur in components having structures similar to the electrostatic chuck, that is, ceramic-metal bonded bodies. An example of the components having structures similar to the electrostatic chuck is a showerhead. The showerhead is a component used for supplying and dispersing a reactant gas to a chamber of a plasma processing apparatus used in a step of semiconductor manufacturing processing.

The present invention has been made in order to solve the above problems, and a main object of the present invention is to prevent a decrease in the contact area and variations in the bonding performance between a plate and a supporting base of a ceramic-metal bonded body.

The present invention is directed to a method of producing a ceramic-metal bonded body by bonding a ceramic plate to a metal supporting base with a bonding sheet containing a resin as a main component, the method including a pre-bake step of heating the bonding sheet in air, in an inert gas, or in a vacuum in advance to reduce the amount of volatile components in the bonding sheet; and a bonding step of bonding the plate to the supporting base with the bonding sheet therebetween by placing the plate, the supporting base, and the bonding sheet in an airtight bag, reducing pressure in the airtight bag, and performing heating at a temperature lower than that of the pre-bake step while applying a pressure in an autoclave.

In this production method, the bonding sheet is heated in advance to reduce the amount of volatile components in the bonding sheet, and the plate is then bonded to the supporting base with the bonding sheet therebetween by placing the plate, the supporting base, and the bonding sheet in a pressure-reduced airtight bag and by applying a pressure to the resulting stacked body in an autoclave. Accordingly, even when the resulting ceramic-metal bonded body is used at high temperatures, gas is not generated from the bonding sheet, and thus no bubbles are generated between the plate and the bonding material and between the supporting base and the bonding material. As a result, a decrease in the contact area between the plate and the supporting base does not occur, and variations in the bonding performance are not generated.

Herein, examples of the plate include plates composed of a ceramic such as silicon carbide, aluminum nitride, alumina, calcium titanate, or barium titanate. Examples of the supporting base include supporting bases composed of aluminum or silicon, and supporting bases composed of a metal-based composite material obtained by impregnating a porous ceramic base material with a metal. Examples of the bonding sheet include bonding sheets composed of an acrylic resin or a silicone resin. The heating conditions in the pre-bake step are appropriately determined in accordance with the material of the bonding sheet. Specifically, the effects of the atmosphere gas, the degree of vacuum, the heating temperature, and the heating time on the bonded interface between the plate and the supporting base are examined by experiments in advance for each material of the bonding sheet. Numerical ranges are then determined in which the bonded interface is not affected and bubbles are not generated from the bonding sheet even when the bonding sheet is heated to a high temperature. The atmosphere in the pre-bake step is preferably an inert gas, and more preferably vacuum rather than air because it is possible to obtain a ceramic-metal bonded body in which separation does not occur and bubbles are not generated at the bonded interface even when the ceramic-metal bonded body is used at higher temperatures. The bonding sheet preferably has a thickness of 0.1 to 0.3 mm and preferably contains metal filler (e.g., aluminum filler). In the bonding step, a sufficient bonding strength can be obtained by conducting a treatment under pressure and heat in the autoclave.

In the method of producing a ceramic-metal bonded body according to the present invention, in the pre-bake step, the bonding sheet may be applied onto the supporting base, and the supporting base to which the bonding sheet is applied may be heated to reduce the amount of volatile components in the bonding sheet. Alternatively, the bonding sheet may be applied onto the plate, and the plate to which the bonding sheet is applied may be heated to reduce the amount of volatile components in the bonding sheet. In this case, the producion method of the present invention can be performed without using a new jig.

In the method of producing a ceramic-metal bonded body according to the present invention, in the pre-bake step, a frame which is a board having an opening having the same shape as the bonding sheet of the ceramic-metal bonded body and a large-size sheet which is formed into the bonding sheet may be prepared, the large-size sheet may be applied onto the frame so that the large-size sheet covers the opening of the frame, and the frame to which the large-size sheet is applied may be heated to reduce the amount of volatile components in the large-size sheet. In this case, the heating time in the pre-bake step can be shortened as compared with the case where the amount of volatile components is reduced by performing heating after the bonding sheet is applied onto the supporting base and the case where the amount of volatile components is reduced by performing heating after the bonding sheet is applied onto the plate. This is because the volatile components are volatilized from one surface of the sheet in the former two methods described above, whereas the volatile components are volatilized from both surfaces of the sheet in the latter method using the frame.

In the method of producing a ceramic-metal bonded body according to the present invention, the resin may be an acrylic resin, and heating conditions in the pre-bake step may be 15 to 30 hours at 120° C. to 130° C. in air. The pre-bake step is preferably performed at 1 atm in an atmosphere of an inert gas such as nitrogen or argon instead of air. Furthermore, the pre-bake step may be performed in a vacuum atmosphere of 2,000 Pa or less (preferably 10 Pa or less, and more preferably 1 Pa or less) at 120° C. to 130° C. for 15 to 30 hours. As for bonding conditions in the bonding step, the body to be bonded may be placed in a heat-resistant resin bag, the resin bag may be degassed and then sealed, and the body to be bonded and the bag containing the body may be subjected to bonding together by a treatment under pressure and heat in an autoclave. The bonding under pressure and heat is preferably performed under the conditions of a temperature lower than the temperature of the pre-bake step, e.g., at 100° C., and a pressure of 10 to 20 MPa. Under these conditions, in the case where a bonding sheet composed of an acrylic resin is used, it is possible to obtain a ceramic-metal bonded body in which separation does not occur and bubbles are not generated at the bonded interface. Herein, a heating temperature of lower than 120° C. in the pre-bake step is not preferable because bubbles are generated at the bonded interface when the resulting bonded body is used at high temperatures. A heating temperature of higher than 130° C. is not preferable because the quality of the bonding sheet is degraded, thereby decreasing the bonding performance. A heating time of shorter than 15 hours in the pre-bake step is not preferable because bubbles may be generated at the bonded interface when the resulting bonded body is used at high temperatures. A heating time of longer than 30 hours is not preferable because the heating time is unnecessarily long and the productivity decreases, though there is no problem in terms of quality of the resulting bonded body.

In the method of producing a ceramic-metal bonded body according to the present invention, the resin may be a silicone resin, and heating conditions in the pre-hake step may be 15 to 30 hours at 140° C. to 170° C. in air. The pre-bake step is preferably performed at 1 atm in an atmosphere of an inert gas such as nitrogen or argon instead of air. Furthermore, the pre-bake step may be performed in a vacuum atmosphere of 2,000 Pa or less (preferably 10 Pa or less, and more preferably 1 Pa or less) at 140° C. to 170° C. for 15 to 30 hours. As for bonding conditions in the bonding step, the body to be bonded may be placed in a heat-resistant resin bag, the resin bag may be degassed and then sealed, and the body to be bonded and the bag containing the body may be subjected to bonding together by a treatment under pressure and heat in an autoclave. The bonding under pressure and heat is preferably performed under the conditions of a temperature 10° C. to 30° C. lower than the temperature of the pre-bake step, e.g., in the range of 120° C. to 140° C., and a pressure of 10 to 20 MPa. Under these conditions, in the case where a bonding sheet composed of a silicone resin is used, it is possible to obtain a ceramic-metal bonded body in which separation does not occur and bubbles are not generated at the bonded interface. Herein, a heating temperature of lower than 140° C. in the pre-bake step is not preferable because bubbles are generated at the bonded interface when the resulting bonded body is used at high temperatures. A heating temperature of higher than 170° C. is not preferable because the quality of the bonding sheet is degraded, thereby decreasing the bonding performance. A heating time of shorter than 15 hours in the pre-bake step is not preferable because bubbles may be generated at the bonded interface when the resulting bonded body is used at high temperatures. A heating time of longer than 30 hours is not preferable because the heating time is unnecessarily long and the productivity decreases, though there is no problem in terms of quality of the resulting bonded body.

In the method of producing a ceramic-metal bonded body according to the present invention, the ceramic-metal bonded body may be an electrostatic chuck used for fixing a wafer by applying suction in a semiconductor manufacturing process or a showerhead used for supplying a reactant gas to a chamber in a semiconductor manufacturing process.

The present invention is also directed to a bonded body including a ceramic plate, a metal supporting base, and a resin bonding sheet that bonds the plate to the supporting base, wherein when the bonded body is heated in a vacuum environment of 100 Pa at 120° C. for 300 hours, the amount of change in the weight of the bonding sheet is 50 $\mu$g/cm$^2$ (where the unit is microgram per square centimeter of a bonded surface) or less. Alternatively, in this case, no bubbles are generated at a bonded interface between the plate and the bonding sheet and a bonded interface between the supporting base and the bonding sheet.

This ceramic-metal bonded body can be obtained by the method of producing a ceramic-metal bonded body according to the present invention. Since the amount of volatile components in the bonding sheet is reduced in the producion, the amount of change in the weight of the bonding sheet is very small even when the ceramic-metal bonded body is exposed to high temperatures.

The ceramic-metal bonded body according to the present invention may be an electrostatic chuck used for fixing a wafer by applying suction in a semiconductor manufacturing process or a showerhead used for supplying a reactant gas to a chamber in a semiconductor manufacturing process.

DETAILED DESCRIPTION OF THE INVENTION

Figure 1:
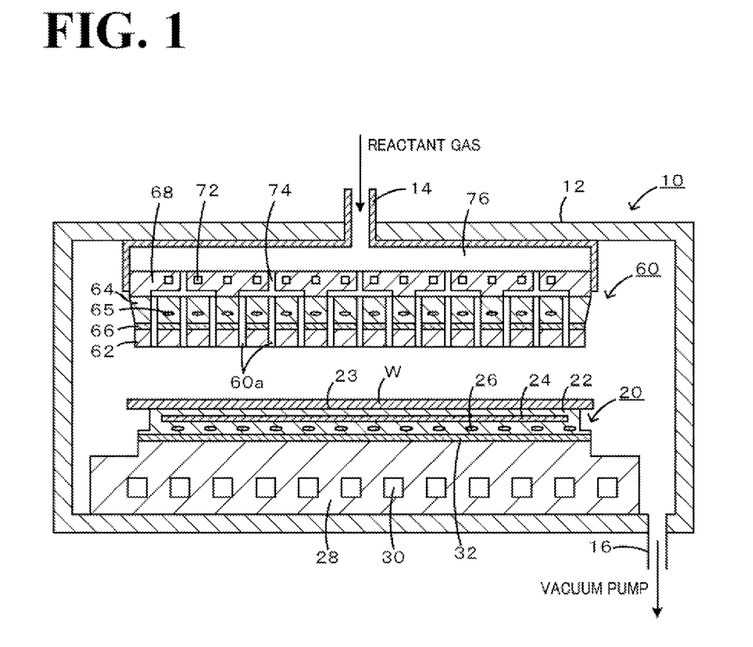
FIG. 1 is a cross-sectional view showing a schematic Configuration of a plasma processing apparatus 10 including an electrostatic chuck 20.

Next, embodiments for carrying out the present invention will be described with reference to the drawings. FIG. 1 is a cross-sectional view showing a schematic configuration of a plasma processing apparatus 10 including an electrostatic chuck 20 and a showerhead 60.

As shown in FIG. 1, the plasma processing apparatus 10 includes a metal (e.g., an aluminum alloy) chamber 12, the internal pressure of which can be controlled, and an electrostatic chuck 20 and a showerhead 60 that are arranged in the chamber 12.

The chamber 12 is configured so that a reactant gas can be supplied from a gas supply path 14 to the showerhead 60 and the internal pressure of the chamber 12 can be reduced to a predetermined degree of vacuum using a vacuum pump connected to an evacuation path 16.

The electrostatic chuck 20 includes a plate 22 that can apply suction to a silicon wafer W to be subjected to a plasma treatment, a cooling plate 28 disposed on the reverse face of the plate 22 and functioning as a supporting base, and a bonding sheet 32 that bonds the plate 22 to the cooling plate 28.

The plate 22 is a disc-shaped ceramic component having a step-like portion on the outer circumference thereof, and the outer diameter of a wafer placing surface 23 is smaller than the outer diameter of the wafer W. This plate 22 includes an electrostatic electrode 24 and a resistance heating element 26 therein. The electrostatic electrode 24 is a planar electrode to which a direct-current voltage can be applied by an external power supply (not shown). Upon applying a direct-current voltage to this electrostatic electrode 24, the wafer W is fixed to the wafer placing surface 23 by applying suction through a Coulomb force or a Johnsen-Rahbek force. Upon releasing the application of the direct-current voltage, the fixation of the wafer W to the wafer placing surface 23 by the suction is released. The resistance heating element 26 is formed as a pattern, for example, in the shape of a single brush stroke so that the resistance heating element 26 is arranged over the entire surface of the plate 22. When a voltage is applied, the resistance heating element 26 generates heat to heat the wafer W. The voltage can be applied to the resistance heating element 26 with bar-shaped terminals (not shown) extending from the reverse face of the cooling plate 28 to each end of the resistance heating element 26. In the case where the plate 22 is formed of alumina, the plate 22 functions as a Coulomb-type electrostatic chuck because of a high volume resistivity of alumina. In the case where the plate 22 is formed of aluminum nitride, the plate 22 functions as a Johnsen-Rahbek-type electrostatic chuck because the volume resistivity of aluminum nitride is lower than that of alumina.

The cooling plate 28 is a disc-shaped aluminum component having a step-like portion on the outer circumference thereof. The outer diameter of the upper surface of the cooling plate 28, the upper surface facing the plate 22, is the same as the outer diameter of the lower surface of the plate 22. The cooling plate 28 includes a cooling medium path 30 through which a cooling medium (for example, water) cooled by an external cooling unit (not shown) circulates. This cooling medium path 30 is formed, for example, in the shape of a single brush stroke so that the cooling medium passes through the entire surface of the cooling plate 28. The cooling plate 28 is fixed to a bottom surface of the chamber 12 with bolts (not shown). Thus, the whole electrostatic chuck 20 is fixed in the chamber 12. A protective ring (not shown) may be arranged on the step-like portion provided on the outer circumference of the cooling plate 28. The protective ring is formed so as not to contact the wafer W and protects the cooling plate 28 from a plasma during the plasma treatment of the wafer W. The protective ring can be replaced according to need. Examples of the material of the protective ring include quartz, alumina, and metal silicon.

The bonding sheet 32 is a layer bonding the plate 22 to the cooling plate 28. The outer diameter of the bonding sheet 32 is the same as the outer diameter of the lower surface of the plate 22 and the outer diameter of the upper surface of the cooling plate 28. This bonding sheet 32 is subjected to a pre-bake treatment described below, is then placed in an airtight bag in a state in which the bonding sheet 32 is sandwiched between the plate 22 and the cooling plate 28, and is vacuum-packed by reducing the pressure in the bag. The whole airtight bag is placed in an autoclave and is treated under pressure and heat. The bonding sheet 32 is preferably composed of an acrylic resin or a silicone resin. The thickness of the bonding sheet 32 is preferably 100 to 300 μm.

The showerhead 60 includes a disc-shaped ceramic plate 62 used for supplying and dispersing a reactant gas to the chamber 12, a truncated cone-shaped metal electrode plate 64 functioning as an upper electrode for generating a plasma, and a bonding sheet 66 bonding the plate 62 to the metal electrode plate 64. A plurality of small holes 60a penetrating through the plate 62, the bonding sheet 66, and the metal electrode plate 64 in the vertical direction are provided in the showerhead 60. The metal electrode plate 64 includes a sheath heater 65 therein. This sheath heater 65 is formed over the entire surface of the metal electrode plate 64 in the shape of a single brush stroke. This bonding sheet 66 is subjected to a pre-bake treatment described below, is then vacuum-packed in a state in which the bonding sheet 66 is sandwiched between the plate 62 and the metal electrode plate 64, is placed in an autoclave, and treated under pressure and heat. The bonding sheet 66 is preferably composed of an acrylic resin or a silicone resin. The showerhead 60 is arranged and fixed so that the upper surface of the metal electrode plate 64 contacts a cooling plate 68 attached to the chamber 12. The cooling plate 68 includes a cooling medium path 72 through which a cooling medium (for example, water) cooled by an external cooling unit (not shown) circulates. The cooling plate 68 is configured so that a reactant gas, which is supplied from the gas supply path 14 connected to the chamber 12 through a gas-holding portion 76, is supplied to the small holes 60a of the showerhead 60 through distribution paths 74.

Next, an example of the use of the plasma processing apparatus 10 having the above configuration will be described. First, a cooling medium cooled to a predetermined temperature (for example, 25° C.) with an external cooling unit (not shown) is circulated through the cooling medium paths 30 and 72. Subsequently, the wafer W is placed on the wafer placing surface 23 of the plate 22. The pressure in the chamber 12 is reduced by a vacuum pump so that the degree of vacuum in the chamber 12 is adjusted to a predetermined value. A direct-current voltage is applied to the electrostatic electrode 24 to generate a Coulomb force or a Johnsen-Rahbek force so that the wafer W is fixed to the wafer placing surface 23 by applying suction. Next, the atmosphere in the chamber 12 is controlled to be a reactant gas atmosphere at a predetermined pressure (for example, several tens of Pa to several hundred Pa). In this state, a high-frequency voltage is applied between the metal electrode plate 64 of the showerhead 60 and the electrostatic electrode 24 of the electrostatic chuck 20 in the chamber 12 to generate a plasma. In this embodiment, both the direct-current voltage for generating an electrostatic force and the high-frequency voltage are applied to the electrostatic electrode 24. Alternatively, the high-frequency voltage may be applied to the cooling plate 28 instead of the electrostatic electrode 24. The surface of the wafer W is etched by the generated plasma. In this step, the temperature of the wafer W is controlled to be constant by adjusting the electrical energy supplied to the resistance heating element 26 or by adjusting the flow rate of the cooling medium circulating through the cooling medium path 30 of the cooling plate 28. Furthermore, the temperature of the showerhead 60 is controlled to be constant by adjusting the electrical energy supplied to the sheath heater 65 or by adjusting the flow rate of the cooling medium circulating through the cooling medium path 72 of the cooling plate 68.

Figure 2:
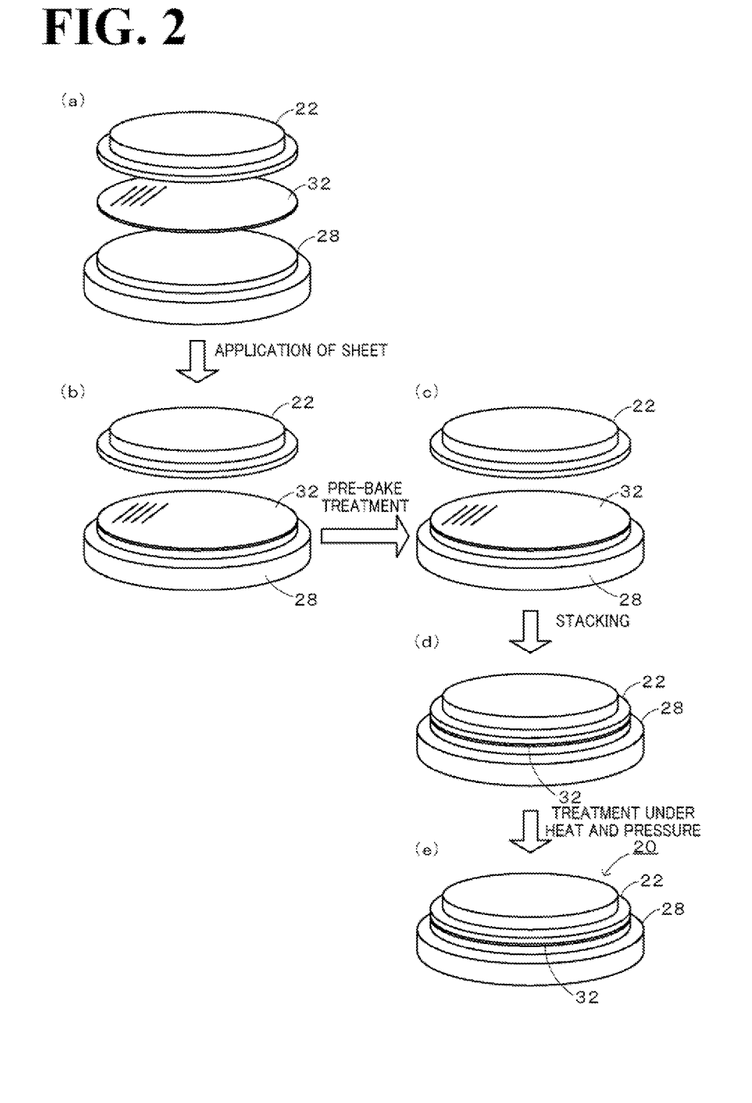
FIG. 2 includes explanatory views showing a first method of producing an electrostatic chuck 20.
Figure 3:
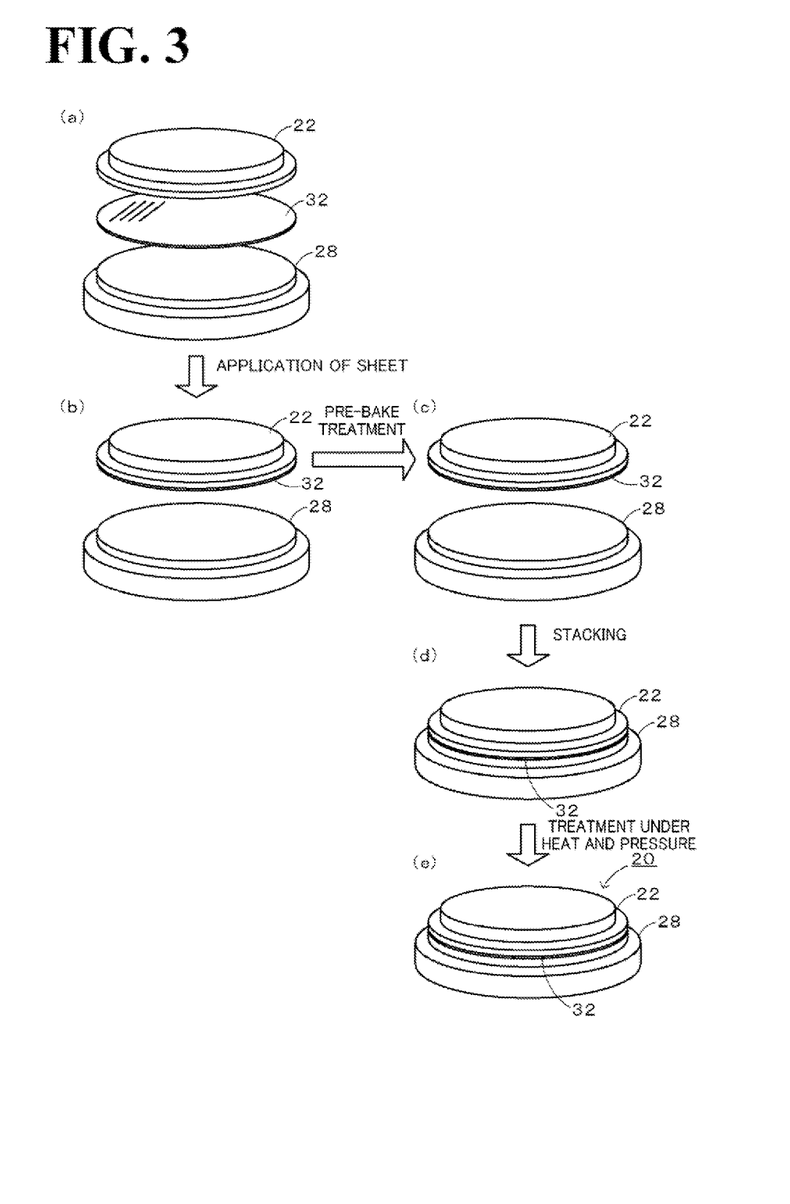
FIG. 3 includes explanatory views showing a second method of producing an electrostatic chuck 20.
Figure 4:
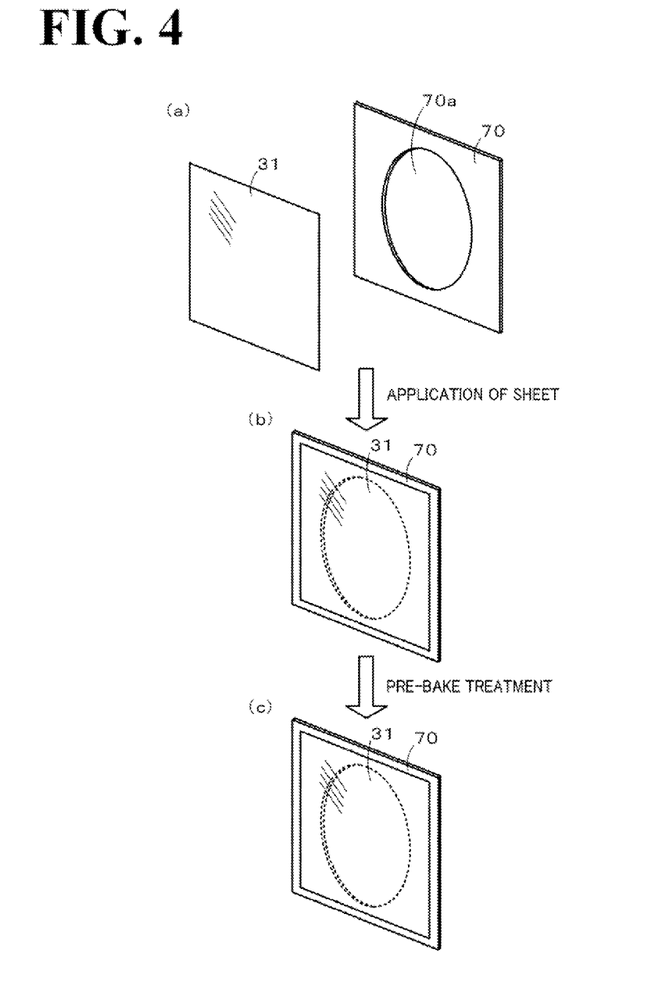
FIG. 4 includes explanatory views showing the first half of a third method of producing an electrostatic chuck 20.
Figure 5:
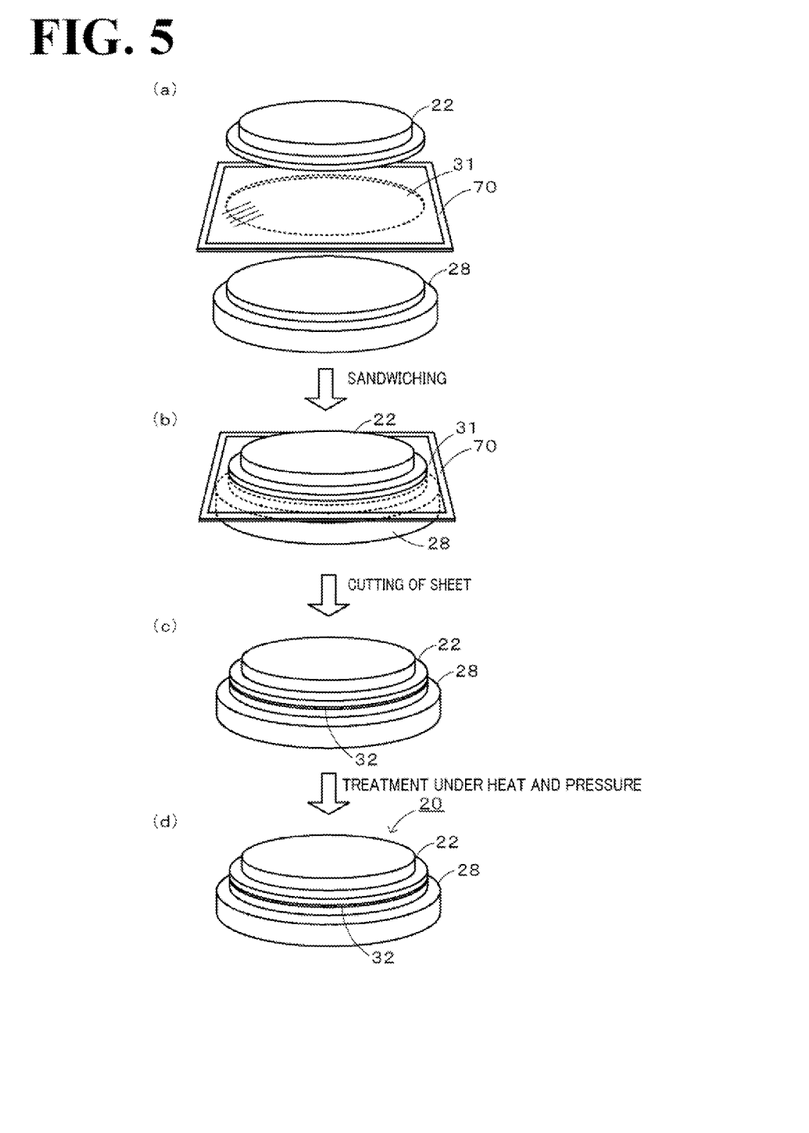
FIG. 5 includes explanatory views showing the second half of the third method of producing an electrostatic chuck 20.

Next, methods of producing an electrostatic chuck 20 will be described. FIG. 2 includes explanatory views showing a first method of producing an electrostatic chuck 20. FIG. 3 includes explanatory views showing a second method of producing an electrostatic chuck 20. FIGS. 4 and 5 include explanatory views showing a third method of producing an electrostatic chuck 20.

Figure 6:
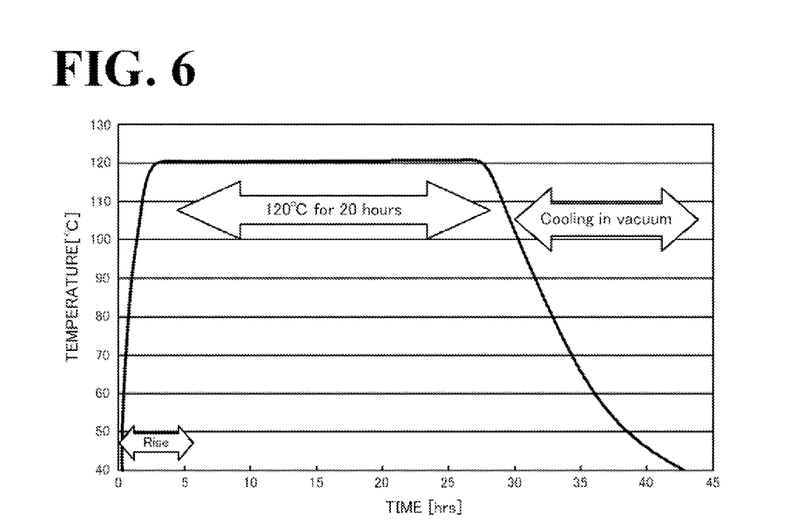
FIG. 6 is a graph showing an example of a temperature history of a pre-bake treatment.
Figure 7:
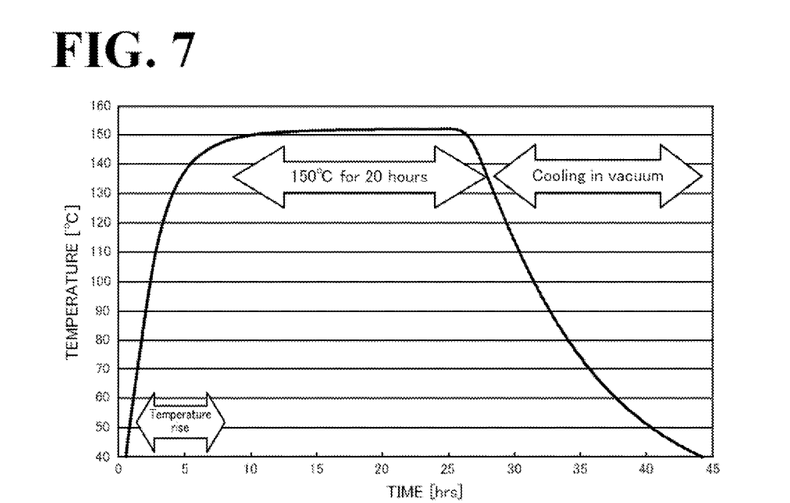
FIG. 7 is a graph showing an example of a temperature history of a pre-bake treatment.

First, the first producion method will be described with reference to the explanatory views of FIG. 2. First, a plate 22, a cooling plate 28, and a double-sided adhesive bonding sheet 32 composed of a resin are prepared (refer to FIG. 2(a)). A bonding sheet having the same shape as the lower surface of the plate 22 and the upper surface of the cooling plate 28 is prepared as the bonding sheet 32. Next, the bonding sheet 32 is applied onto the upper surface of the cooling plate 28 (refer to FIG. 2(b)). Subsequently, the cooling plate 28 to which the bonding sheet 32 is applied is placed in a dryer, and a pre-bake treatment is conducted in an air atmosphere, or in an atmosphere in which air in the dryer is replaced with an inert gas such as nitrogen or argon, or in an atmosphere in which the pressure in the dryer is reduced to 2,000 Pa or less (preferably 10 Pa or less, and more preferably 1 Pa or less) (refer to FIG. 2(c)). In the case where the bonding sheet 32 is composed of an acrylic resin, the pre-hake treatment is conducted at 120° C. to 130° C. for 15 to 30 hours, and natural cooling is then conducted in the dryer. FIG. 6 shows an example of a temperature history of this case. On the other hand, in the case where the bonding sheet 32 is composed of a silicone resin, the pre-bake treatment is conducted at 140° C. to 170° C. for 15 to 30 hours, and natural cooling is then conducted in the dryer in a vacuum. FIG. 7 shows an example of a temperature history of this case. The amount of volatile components in the bonding sheet 32 is reduced by this pre-bake treatment. After the pre-bake treatment, the plate 22 is stacked on the bonding sheet 32 so that the lower surface of the plate 22 is aligned with the upper surface of the bonding sheet 32 applied onto the cooling plate 28 (refer to FIG. 2(d)). The resulting stacked body is placed in a heat-resistant resin bag, and is then placed in an autoclave. The stacked body in the heat-resistant resin hag is treated for 3 to 6 hours at a pressure of 10 to 20 MPa under heating at a temperature 10° C. to 30° C. lower than the temperature of the pre-bake treatment. Thus, the plate 22 is closely bonded to the cooling plate 28, with the bonding sheet 32 therebetween, to obtain an electrostatic chuck 20 (refer to FIG. 2(e)).

Next, the second producion method will be described with reference to the explanatory views of FIG. 3. First, a plate 22, a cooling plate 28, and a double-sided adhesive bonding sheet 32 composed of a resin are prepared (refer to FIG. 3(a)). A bonding sheet similar to that used in the first producion method is prepared as the bonding sheet 32. Next, the bonding sheet 32 is applied onto the lower surface of the plate 22 (refer to FIG. 3(b)). Next, the plate 22 to which the bonding sheet 32 is applied is placed in a dryer, and a pre-bake treatment is conducted in an air atmosphere, or in an atmosphere in which air in the dryer is replaced with an inert gas such as nitrogen or argon, or in an atmosphere in which the pressure in the dryer is reduced to 2,000 Pa or less (preferably 10 Pa or less, and more preferably 1 Pa or less) (refer to FIG. 3(c)). The pre-bake treatment is conducted under the same conditions as the first producion method. Thus, the amount of volatile components in the bonding sheet 32 is reduced. After the pre-bake treatment, the plate 22 is stacked on the cooling plate 28 so that the upper surface of the cooling plate 28 is aligned with the lower surface of the bonding sheet 32, which is applied onto the plate 22 (refer to FIG. 3(d)). The resulting stacked body is placed in a heat-resistant resin bag, and is then placed in an autoclave. The stacked body in the heat-resistant resin bag is treated for several hours under pressure and heat. Thus, an electrostatic chuck 20 is obtained (refer to FIG. 3(e)).

Next, the third producion method will be described with reference to the explanatory views of FIGS. 4 and 5. First, a frame 70 which is a board having an opening 70a having the same shape as a bonding sheet 32, and a double-sided adhesive large-size sheet 31 composed of a resin are prepared (refer to FIG. 4(a)). A sheet having a size larger than the lower surface of a plate 22 and the upper surface of a cooling plate 28 is prepared as the large-size sheet 31. Next, the large-size sheet 31 is applied onto the frame 70 so that the large-size sheet 31 covers the opening 70a of the frame 70 (refer to FIG. 4(b)). Next, the frame 70 to which the large-size sheet 31 is applied is placed in a dryer, and a pre-bake treatment is conducted in an air atmosphere, or in an atmosphere in which air in the dryer is replaced with an inert gas such as nitrogen or argon, or in an atmosphere in which the pressure in the dryer is reduced to 2,000 Pa or less (preferably 10 Pa or less, and more preferably 1 Pa or less) (refer to FIG. 4(c)). The pre-bake treatment is conducted under the same conditions as the first producion method. However, the treatment time may be shorter than that in the first and second producion methods because volatile components are volatilized from both surfaces of the large-size sheet 31. Thus, the amount of volatile components in the large-size sheet 31 is reduced. Next, the plate 22 and the cooling plate 28 are prepared (refer to FIG. 5(a)). A portion of the large-size sheet 31, the portion covering the opening 70a of the frame 70, is sandwiched between the plate 22 and the cooling plate 28 (refer to FIG. 5(b)). The large-size sheet 31 is then cut along the outer edge of the cooling plate 28. Thus, the large-size sheet 31 is formed into a bonding sheet 32 (refer to FIG. 5(c)). The resulting stacked body is placed in a heat-resistant resin bag, and is then placed in an autoclave. The stacked body in the heat-resistant resin bag is treated for several hours under pressure and heat. Thus, an electrostatic chuck 20 is obtained (refer to FIG. 5(d)).

The electrostatic chucks 20 obtained by the first to third producion methods were heated in a vacuum environment of 100 Pa at 120° C. for 300 hours. The amount of change in the weight per square centimeter of the bonding sheet was 25 μg/cm$^2$ (where the unit is microgram per square centimeter of a bonded surface) or less, and no bubbles were generated at a bonded interface between the plate 22 and the bonding sheet 32 and a bonded interface between the cooling plate 28 and the bonding sheet 32.

Next, a method of producing a showerhead 60 will be described. The showerhead 60 can be produced in accordance with any of the first to third methods of producing an electrostatic chuck 20.

First, a description will be made of a case where a showerhead 60 is produced in accordance with the first method of producing an electrostatic chuck 20. First, a ceramic plate 62, a metal electrode plate 64, and a double-sided adhesive bonding sheet 66 composed of a resin are prepared. The bonding sheet 66 is a sheet similar to the bonding sheet 32. Holes are formed through the plate 62, the metal electrode plate 64, and the bonding sheet 66 in advance at positions corresponding to small holes 60a. Next, the bonding sheet 66 is applied onto the metal electrode plate 64 so that the holes are aligned with each other. Next, the metal electrode plate 64 to which the bonding sheet 66 is applied is placed in a dryer, and the above-described pre-bake treatment is conducted in an air atmosphere, or in an atmosphere in which air in the dryer is replaced with an inert gas such as nitrogen or argon, or in an atmosphere in which the pressure in the dryer is reduced to 2,000 Pa or less (preferably 10 Pa or less, and more preferably 0.1 Pa or less). The amount of volatile components in the bonding sheet 66 is reduced by this pre-bake treatment. After the pre-bake treatment, the plate 62 is stacked on the bonding sheet 66, which is applied to the metal electrode plate 64, so that the holes are aligned with each other. The resulting stacked body is placed in a heat-resistant resin bag, and the resin bag is then hermetically sealed by reducing the pressure in the bag. The stacked body and the bag containing the stacked body are placed together in an autoclave, and are treated for 3 to 6 hours at a pressure of 10 to 20 MPa under heating at a temperature 10° C. to 30° C. lower than the temperature of the pre-bake treatment. Thus, the showerhead 60 is obtained.

Next, a description will be made of a case where a showerhead 60 is produced in accordance with the second method of producing an electrostatic chuck 20. First, a plate 62, a metal electrode plate 64, and a double-sided adhesive bonding sheet 66 composed of a resin are prepared. The bonding sheet 66 is a sheet similar to the bonding sheet 32. Holes are formed through the plate 62, the metal electrode plate 64, and the bonding sheet 66 in advance at positions corresponding to small holes 60a. Next, the bonding sheet 66 is applied onto the plate 62 so that the holes are aligned with each other. Next, the plate 62 to which the bonding sheet 66 is applied is placed in a dryer, and the above-described pre-bake treatment is conducted in an air atmosphere, or in an atmosphere in which air in the dryer is replaced with an inert gas such as nitrogen or argon, or in an atmosphere in which the pressure in the dryer is reduced to 2,000 Pa or less (preferably 10 Pa or less, and more preferably 0.1 Pa or less). The amount of volatile components in the bonding sheet 66 is reduced by this pre-bake treatment. After the pre-bake treatment, the metal electrode plate 64 is stacked on the bonding sheet 66, which is applied to the plate 62, so that the holes are aligned with each other. The resulting stacked body is placed in a heat-resistant resin bag, and is then placed in an autoclave. The stacked body in the heat-resistant resin bag is treated for several hours under pressure and heat. Thus, the showerhead 60 is obtained.

Next, a description will be made of a case where a showerhead 60 is produced in accordance with the third method of producing an electrostatic chuck 20. First, a frame which is a board having an opening having the same shape as a bonding sheet 66, and a double-sided adhesive large-size sheet (sheet having a size larger than the bonding sheet 66) composed of a resin are prepared. Holes are formed through the large-size sheet in advance at positions corresponding to small holes 60a. Next, the large-size sheet is applied onto the frame so that the large-size sheet covers the opening of the frame. Next, the frame to which the large-size sheet is applied is placed in a dryer, and the above-described pre-bake treatment is conducted in an air atmosphere, or in an atmosphere in which air in the dryer is replaced with an inert gas such as nitrogen or argon, or in an atmosphere in which the pressure in the dryer is reduced to 2,000 Pa or less (preferably 10 Pa or less, and more preferably 1 Pa or less). However, the treatment time may be shorter than that in the first and second producion methods. Thus, the amount of volatile components in the large-size sheet is reduced. Next, a plate 62 and a metal electrode plate 64 are prepared. A portion of the large-size sheet, the portion covering the opening of the frame, is sandwiched between the plate 62 and the metal electrode plate 64 so that the holes formed in the respective components are aligned with the corresponding holes. The large-size sheet is then cut along the outer edge of the metal electrode plate 64. Thus, the large-size sheet is formed into a bonding sheet 66. The resulting stacked body is placed in a heat-resistant resin hag, and is then placed in an autoclave. The stacked body in the heat-resistant resin bag is treated for several hours under pressure and heat. Thus, the showerhead 60 is obtained.

According to the methods of producing an electrostatic chuck 20 or a showerhead 60 that have been described in detail above, the contact area between the plate 22 and the cooling plate 28 and the contact area between the plate 62 and the metal electrode plate 64 do not decrease, and variations in the bonding strength of the contact surface are not generated. Specifically, regarding the electrostatic chuck 20, the bonding sheet 32 is heated in advance in a vacuum so as to reduce the amount of volatile components in the bonding sheet 32, and the plate 22 and the cooling plate 28 are then bonded by a treatment under pressure and heat. Accordingly, even when the resulting electrostatic chuck 20 is used at high temperatures, gas is not generated from the bonding sheet 32, and bubbles are not generated between the plate 22 and the bonding sheet 32 or between the cooling plate 28 and the bonding sheet 32. As a result, a decrease in the contact area between the plate 22 and the cooling plate 28 does not occur and variations in the bonding performance are not generated, and thus the temperature uniformity of the wafer W subjected to suction is satisfactory. Furthermore, in controlling the temperature of the wafer W to be constant, the electric power supplied to the resistance heating element 26 is stabilized, and thus the temperature control can be easily performed. These advantages can also be similarly achieved in the showerhead 60. Furthermore, in the case of the electrostatic chuck 20, generated gas does not adhere to the surface of the plate 22, and thus the responsiveness of applying suction to and releasing the wafer W can be satisfactorily maintained.

In the first and second methods of producing an electrostatic chuck 20, volatile components are volatilized from one surface of the bonding sheet 32 during the pre-bake treatment. On the other hand, in the third production method, volatile components are volatilized from both surfaces of the large-size sheet 31, and thus the pre-bake treatment can be completed in a short time. This point also applies to the showerhead 60.

It is to be understood that the present invention is not limited to the embodiments described above, and can be implemented in various embodiments without departing from the technical scope of the present invention.

In the above embodiments, an electrostatic chuck 20 including a plate 22 having a resistance heating element 26 therein is used. However, this resistance heating element 26 may be omitted. Also, a showerhead 60 including a metal electrode plate 64 having a sheath heater 65 therein is used in the above embodiments. However, this sheath heater 65 may be omitted.

In the above embodiments, bonding sheets composed of an acrylic resin or a silicone resin are exemplified as the bonding sheets 32 and 66, and conditions of the pre-bake treatment of the bonding sheets have been described in detail. Alternatively, bonding sheets composed of other resins may be used. In such a case, conditions of the pre-bake treatment (such as the treatment temperature and the treatment time) suitable for the resins are determined in advance by experiments. Specifically, as described in Examples below, a relationship among the treatment temperature, the treatment time, and the appearance of a bonded interface (e.g., the occurrence or non-occurrence of separation) is examined in advance, and the conditions are then determined.

EXAMPLES

Reference Example

Figure 8:
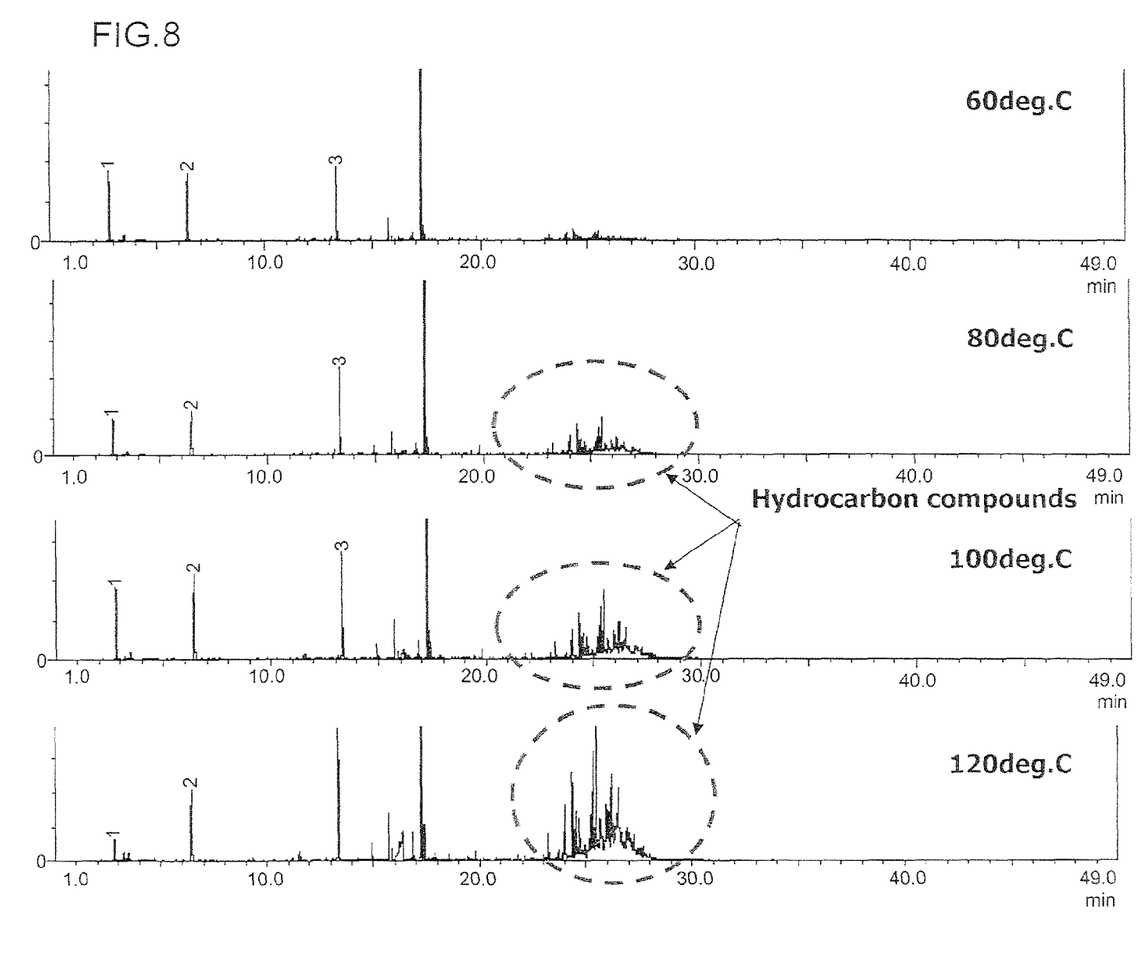
FIG. 8 includes charts showing analytical results of gas chromatography-mass spectrometry (GC-MS) of gas components.

Gas components generated from a bonding sheet composed of an acrylic resin were analyzed by dynamic headspace-gas chromatography-mass spectrometry (DHS-GC-MS). Specifically, a bonding sheet composed of an acrylic resin was placed in a chamber, and the chamber was evacuated to a high vacuum state. Subsequently, the chamber was heated to a predetermined temperature (60° C., 80° C., 100° C., or 120° C.), and a carrier gas was supplied in this state at a flow rate of 500 mL/min. A generated gas was collected on an adsorbent and concentrated, and gas components were then analyzed by gas chromatography-mass spectrometry (GC-MS). Electron impact (EI; 70 eV) was employed as an ionization method of the mass spectrometer. FIG. 8 includes charts showing the analytical results. FIG. 8 shows that the gas components generated from this bonding sheet are mainly hydrocarbon compounds.

Example 1

An electrostatic chuck in which an alumina plate 22 having a diameter φ of 297 mm and a thickness of 3 mm is bonded to an aluminum (Al) cooling plate 28 having a diameter φ of 297 mm and a thickness of 18 mm with an acrylic resin bonding sheet 32 having a thickness of 0.15 mm was produced as an example of an electrostatic chuck 20. This electrostatic chuck 20 was produced in accordance with the first producion method described above. Specifically, a bonding sheet 66 was applied onto the Al cooling plate 28, and a pre-bake treatment was then conducted. In the pre-bake treatment, the temperature was increased at a rate of 32° C./h in a special furnace in which the pressure was reduced to 10 Pa or less. When the temperature reached 120° C., the temperature was controlled to be constant and maintained at 120° C. for 20 hours. The temperature was then decreased at a rate of 4° C./h. The cooling plate 28 to which the bonding sheet 66 was applied was then bonded to the plate 22. Specifically, the cooling plate 28 and the plate 22 were aligned with and temporarily bonded to each other, and the resulting temporarily bonded body was then placed in a heat-resistant resin bag. The resin bag was degassed until the pressure in the bag was reduced to 1,000 Pa or less, and was then sealed. Next, the temporarily bonded body and the bag containing the temporarily bonded body were subjected to a bonding together in an autoclave by a treatment under pressure and heat. The bonding treatment under pressure and heat was conducted under the conditions of 100° C. and a pressure of 14 MPa for four hours.

Comparative Example 1

The electrostatic chuck 20 of Example 1 was produced by an existing method. Specifically, the electrostatic chuck 20 was produced by the same method as in Example 1 except that the pre-bake treatment in Example 1 was not performed.

Confirmation of Effect of Example 1 and Comparative Example 1

Figure 9:
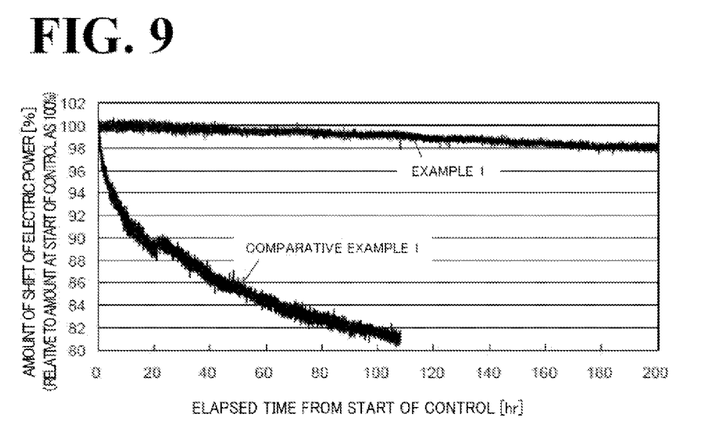
FIG. 9 is a graph showing a relationship between the elapsed time from the start of control and the amount of shift of the electric power.

The electrostatic chucks 20 of Example 1 and Comparative Example 1 were each placed in a chamber 12 as shown in FIG. 1, and a test for confirming the effect was conducted. A certain amount of cooling water at 45° C. was made to flow in a cooling medium path 30 of the cooling plate 28 of the electrostatic chuck 20, and an electric power was supplied to a resistance heating element 26 buried in the plate 22. Thus, the electric power supplied to the resistance heating element 26 was controlled so that the surface temperature of the plate 22 became a predetermined temperature (90° C. in Example 1 and 80° C. in Comparative Example 1). The surface temperature of the plate 22 was measured by bringing a thermocouple into contact with the center of the plate 22. According to the results, after 100 hours from the start of control, the electric power was decreased by close to 20 in Comparative Example 1, whereas the electric power was decreased by only about 1% in Example 1, though the predetermined temperature was higher. FIG. 9 shows the results of this test. This change in the electric power means that bubbles are generated at the bonded interface, and heat transfer between the plate 22 and the cooling plate 28 changes so as to become small. Specifically, in the case where a certain electric power is supplied in the chamber, the surface temperature of the plate 22 changes so as to increase in a portion of the bonded interface where the bubbles are generated. Furthermore, the bubbles are unevenly generated in the plane, and the surface temperature distribution of the plate 22 changes. When the temperature or the temperature distribution of the surface of the plate 22 changes, the reactive species in the plasma significantly changes. Consequently, for example, the etching rate in an etching step varies in the plane of a wafer, resulting in a decrease in the yield of devices.

In order to confirm the above phenomenon, the electric power supplied to the resistance heating element 26 was controlled so that the surface temperature of each of the electrostatic chucks 20 of Example 1 and Comparative Example 1 became 65° C., and the temperature distribution of the surface of each of the electrostatic chucks 20 was measured. In Example 1, the highest temperature was 66.2° C., the lowest temperature was 62.5° C., the average temperature was 64.6° C., and the temperature range (=the highest temperature−the lowest temperature) was 3.7° C. In Comparative Example 1, the highest temperature was 66.3° C., the lowest temperature was 62.7° C., the average temperature was 64.8° C., and the temperature range (=the highest temperature−the lowest temperature) was 3.6° C. There was no difference between Example 1 and Comparative Example 1. Subsequently, the surface temperature distribution of the plate 22 after 300 hours from the start of control was examined. In Example 1, the highest temperature was 66.4° C., the lowest temperature was 62.5° C., the average temperature was 64.8° C., and the temperature range (=the highest temperature−the lowest temperature) was 3.9° C. In contrast, in Comparative Example 1, the highest temperature was 67.7° C., the lowest temperature was 62.3° C., the average temperature was 65.1° C., and the temperature range was 5.4° C. These results show that the temperature uniformity of the plate 22 in Example 1 was stable as compared with Comparative Example 1.

Example 2

A showerhead including a silicon carbide (SiC) plate 62 having a diameter φ of 430 mm and a thickness of 4 mm and a metal electrode plate 64 composed of aluminum (Al), having a tapered outer circumference with a diameter φ of one surface of 430 mm and a diameter φ of another surface of 450 mm, and having a thickness of 20 mm, the plate 62 and the metal electrode plate 64 being bonded to each other with a silicone resin bonding sheet 66 having a thickness of 0.25 mm therebetween, was produced as an example of a showerhead 60. Small holes 60a each had a diameter φ of 0.1 mm, and the distance between adjacent small holes 60a was 4 mm. This showerhead 60 was produced in accordance with the second producion method described above. Specifically, the bonding sheet 66 was applied onto the SiC plate 62, and a pre-bake treatment was then conducted. In the pre-bake treatment, the temperature of the plate 62 was increased at a rate of 10° C./h in a special furnace in which the pressure was reduced to 10 Pa or less. When the temperature reached 150° C., the temperature was controlled to be constant and maintained at 150° C. for 20 hours. The temperature was then decreased at a rate of 5° C./h. The plate 62 to which the bonding sheet 66 was applied was then bonded to the metal electrode plate 64. Specifically, the plate 62 and the metal electrode plate 64 were aligned with and temporarily bonded to each other, and the resulting temporarily bonded body was then placed in a heat-resistant resin bag. The resin bag was degassed until the pressure in the bag reduced to 1,000 Pa or less, and was then sealed. Next, the temporarily bonded body and the bag containing the temporarily bonded body were subjected to a bonding together in an autoclave by a treatment under pressure and heat. The bonding treatment under pressure and heat was conducted under the conditions of 100° C. and a pressure of 14 atm for five hours.

Comparative Example 2

The showerhead 60 of Example 2 was produced by an existing method. Specifically, the showerhead 60 was produced by the same method as in Example 2 except that the pre-bake treatment in Example 2 was not performed.

Confirmation of Effect of Example 2 and Comparative Example 2

Figure 10:
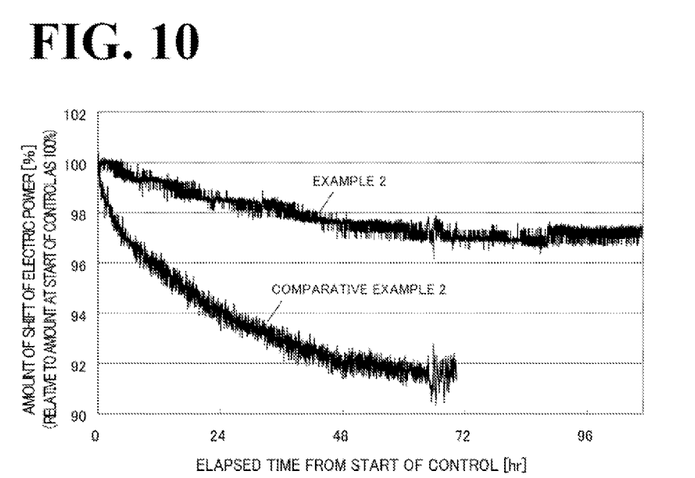
FIG. 10 is a graph showing a relationship between the elapsed time from the start of control and the amount of shift of the electric power.

The showerheads 60 of Example 2 and Comparative Example 2 were each placed in a chamber 12 shown in FIG. 1, and a test for confirming the effect was conducted. The showerhead 60 was arranged and fixed so that the upper surface of the metal electrode plate 64 contacted a cooling plate 68 attached to the chamber 12. Next, a certain amount of cooling water at 60° C. was made to flow in a cooling medium path 72 of the cooling plate 68, and an electric power was supplied to a sheath heater 65 buried in the metal electrode plate 64. Thus, the electric power supplied to the sheath heater 65 was controlled so that the surface temperature of the plate of the showerhead 60 became 90° C. The surface temperature of the plate was measured by a thermocouple fixed to the surface of the plate with a ceramic bond, and was used for the temperature control. According to the results, after 70 hours from the start of control, the electric power was decreased by 8 in Comparative Example 2, whereas the electric power was decreased by only about 3 in Example 2. FIG. 10 shows the results of this test. This change in the electric power shows that the temperature of the surface of the plate 62 of the showerhead 60 significantly changes. Specifically, when the heat input from the plasma and the temperature of the surface of the plate 62 change, the reactive species in the plasma significantly changes. Consequently, for example, the etching rate in an etching step varies in the plane of a wafer, resulting in a decrease in the yield of devices. In fact, the yield (percentage of the number of acceptable products to the total number of products) in the etching step in Comparative Example 2 was 88%, whereas the yield was 99% or more in Example 2.

Examination of Pre-bake Conditions of Acrylic Resin Sheet

A surface of a double-sided adhesive bonding sheet composed of an acrylic resin was applied onto a transparent glass plate, which was a dummy of a plate of an electrostatic chuck. The transparent glass plate was placed in a vacuum dryer in a state in which the other surface of the bonding sheet was exposed, and the pressure in the dryer was reduced to 10 Pa or less (7 to 8 Pa). A pre-bake treatment was then conducted. Specifically, heating was conducted under the conditions of each treatment temperature and each treatment time shown in Table 1 below while maintaining this pressure. After the pre-bake treatment, another transparent glass plate, which was a dummy of a cooling plate, was placed on the bonding sheet applied to the transparent glass plate, and temporarily bonded to the bonding sheet. The resulting temporarily bonded body was then placed in a heat-resistant resin bag. The air in the heat-resistant resin bag was evacuated until the pressure in the hag reduced to 1,000 Pa or less, and the bag was then hermetically sealed. The bag was then placed in an autoclave furnace, and heated at 100° C. at 14 atm for five hours to obtain a glass-glass bonded body in which the pair of transparent glass plates are bonded to each other with the bonding sheet therebetween. Here, the bonding performance at the bonded interface between each glass plate and the bonding sheet was observed. The results are shown in Table 1. As shown in Table 1, when the temperature in the pre-bake treatment was in the range of 110° C. to 130° C., the bonding was satisfactorily performed. However, at 140° C., separation or the like occurred, and the bonding performance was not satisfactory.

TABLE 1

| Treatment Temperature | Treatment Time | | | | |
| --- | --- | --- | --- | --- | --- |
| | 10 hrs | 15 hrs | 20 hrs | 30 hrs | 40 hrs |
| 110° C. | Satisfactory | Satisfactory | Satisfactory | Satisfactory | Satisfactory |
| 120° C. | Satisfactory | Satisfactory | Satisfactory | Satisfactory | Satisfactory |
| 130° C. | Satisfactory | Satisfactory | Satisfactory | Satisfactory | Satisfactory |
| 140° C. | Unsatisfactory | Unsatisfactory | Unsatisfactory | Unsatisfactory | Unsatisfactory |

Next, the glass-glass bonded body obtained as described above was heated at 120° C. at 100 Pa for 300 hours, and the presence or absence of defects (presence or absence of bubbles) at the bonded interface between each glass plate and the bonding sheet was examined (evaluation test). The results are shown in Table 2 below. Furthermore, an Al plate-Al plate bonded body was prepared by using Al plates instead of the transparent glass plates in accordance with the above method of producing the glass-glass bonded body, and a change in the thermal conductivity was examined. The results are shown in Table 3 below. The thermal conductivity was measured by the heat flow meter method (in accordance with JIS-A1412, ASTM-C518, and ISO8301). Each of the numerical values (·) shown in Table 3 is a change ratio of the value measured after the above-described evaluation test to a reference value measured immediately after producing the Al plate-Al plate bonded body. Referring to the results shown in Tables 2 and 3, in the case where the acrylic resin bonding sheet is used, the treatment temperatures and the treatment times shown by symbol O in Table 4 are suitable for the pre-bake conditions. Pre-bake conditions of a treatment temperature of 110° C. to 130° C. and a treatment time of 40 hours also provided satisfactory results. However, these pre-bake conditions are not preferable because the treatment time is unnecessarily long, thereby decreasing productivity.

TABLE 2

| Treatment Temperature | Treatment Time | | | | |
|---|---|---|---|---|---|
| | 10 hrs | 15 hrs | 20 hrs | 30 hrs | 40 hrs |
| 110° C. | Bubbles present | Bubbles present | Bubbles present | Bubbles present | No defect |
| 120° C. | Bubbles present | No defect | No defect | No defect | No defect |
| 130° C. | Bubbles present | No defect | No defect | No defect | No defect |

TABLE 3

| Treatment Temperature | Treatment Time | | | | |
|---|---|---|---|---|---|
| | 10 hrs | 15 hrs | 20 hrs | 30 hrs | 40 hrs |
| 110° C. | 8% | 8% | 8% | 7% | 3% |
| 120° C. | 8% | 3% | 3% | 3% | 2% |
| 130° C. | 7% | 2% | 2% | 2% | 2% |

TABLE 4

| Treatment Temperature | Treatment Time | | | | |
|---|---|---|---|---|---|
| | 10 hrs | 15 hrs | 20 hrs | 30 hrs | 40 hrs |
| 110° C. | | | | | O |
| 120° C. | | O | O | O | O |
| 130° C. | | O | O | O | O |
| 140° C. | | | | | |

Examination of Pre-bake Conditions of Silicone Resin Sheet

A surface of a double-sided adhesive bonding sheet composed of a silicone resin was applied onto a transparent glass plate, which was a dummy of a plate of an electrostatic chuck. The transparent glass plate was placed in a vacuum dryer in a state in which the other surface of the bonding sheet was exposed, and the pressure in the dryer was reduced to 10 Pa or less (7 to 8 Pa). A pre-bake treatment was then conducted. Specifically, heating was conducted under the conditions of each treatment temperature and each treatment time shown in Table 5 below while maintaining this pressure. After the pre-bake treatment, another transparent glass plate, which was a dummy of a cooling plate, was placed on the bonding sheet applied to the transparent glass plate, and temporarily bonded to the bonding sheet. The resulting temporarily bonded body was then placed in a heat-resistant resin bag. The air in the heat-resistant resin bag was evacuated, and the bag was then hermetically sealed. The bag was then placed in an autoclave furnace, and heated at 100° C. at 14 atm for five hours to obtain a glass-glass bonded body in which the pair of transparent glass plates are bonded to each other with the bonding sheet therebetween. Here, the bonding performance at the bonded interface between each glass plate and the bonding sheet was observed. The results are shown in Table 5. As shown in Table 5, when the temperature in the pre-bake treatment was in the range of 120° C. to 170° C., the bonding was satisfactorily performed. However, at 180° C., separation or the like occurred, and the bonding performance was not satisfactory.

TABLE 5

| Treatment Temperature | Treatment Time | | | | |
|---|---|---|---|---|---|
| | 10 hrs | 15 hrs | 20 hrs | 30 hrs | 40 hrs |
| 120° C. | Satisfactory | Satisfactory | Satisfactory | Satisfactory | Satisfactory |
| 140° C. | Satisfactory | Satisfactory | Satisfactory | Satisfactory | Satisfactory |
| 160° C. | Satisfactory | Satisfactory | Satisfactory | Satisfactory | Satisfactory |
| 170° C. | Satisfactory | Satisfactory | Satisfactory | Satisfactory | Satisfactory |
| 180° C. | Unsatisfactory | Unsatisfactory | Unsatisfactory | Unsatisfactory | Unsatisfactory |

Next, the glass-glass bonded body obtained as described above was heated at 120° C. at 100 Pa for 300 hours, and the presence or absence of defects (presence or absence of bubbles) at the bonded interface between each glass plate and the bonding sheet was examined (evaluation test). The results are shown in Table 6 below. Furthermore, an Al plate-Al plate bonded body was prepared by using Al plates instead of the transparent glass plates in accordance with the above method of producing the glass-glass bonded body, and a change in the thermal conductivity was examined. The results are shown in Table 7 below. The method for measuring the thermal conductivity and the numerical values (%) shown in Table 7 are the same as those described above. Referring to the results shown in Tables 6 and 7, in the case where the silicone resin bonding sheet is used, the treatment temperatures and the treatment times shown by symbol O in Table 8 are suitable for the pre-bake conditions. Pre-bake conditions of a treatment temperature of 140° C. to 170° C. and a treatment time of 40 hours also provided satisfactory results. However, these pre-bake conditions are not preferable because the treatment time is unnecessarily long, thereby decreasing productivity.

TABLE 6

| Treatment Temperature | Treatment Time | | | | |
|---|---|---|---|---|---|
| | 10 hrs | 15 hrs | 20 hrs | 30 hrs | 40 hrs |
| 120° C. | Bubbles present | Bubbles present | Bubbles present | Bubbles present | Bubbles present |
| 140° C. | Bubbles present | No defect | No defect | No defect | No defect |
| 160° C. | Bubbles present | No defect | No defect | No defect | No defect |
| 170° C. | Bubbles present | No defect | No defect | No defect | No defect |

TABLE 7

| Treatment Temperature | Treatment Time | | | | |
|---|---|---|---|---|---|
| | 10 hrs | 15 hrs | 20 hrs | 30 hrs | 40 hrs |
| 120° C. | 8% | 8% | 8% | 8% | 8% |
| 140° C. | 8% | 3% | 3% | 3% | 2% |
| 160° C. | 8% | 2% | 2% | 2% | 2% |
| 170° C. | 8% | 2% | 2% | 1% | 1% |

TABLE 8

| Treatment Temperature | Treatment Time | | | | |
|---|---|---|---|---|---|
| | 10 hrs | 15 hrs | 20 hrs | 30 hrs | 40 hrs |
| 120° C. | | | | | |
| 140° C. | | O | O | O | O |
| 160° C. | | O | O | O | O |
| 170° C. | | O | O | O | O |
| 180° C. | | | | | |

Next, a glass-glass bonded body was produced by the same method as the method described above except that, in producing a glass-glass bonded body using a bonding sheet composed of a silicone resin, the pressure in the dryer during the pre-bake treatment was set to 0.01 Pa, and heating was conducted under the conditions of each treatment temperature and each treatment time shown in Table 9 below while maintaining this pressure. This glass-glass bonded body was heated at 160° C. at 100 Pa for 300 hours, and the presence or absence of defects (presence or absence of bubbles) at the bonded interface between each glass plate and the bonding sheet was examined (evaluation test). The results are shown in Table 9. As is apparent from Table 9, in the glass-glass bonded body subjected to the pre-bake treatment under the conditions of a high vacuum of 0.01 Pa and the appropriate treatment temperature and treatment time shown in Table 8, no bubbles were generated at the bonded interface even at a high temperature of 160° C. in the evaluation test.

TABLE 9

| Treatment Temperature | Treatment Time | | | | |
|---|---|---|---|---|---|
| | 10 hrs | 15 hrs | 20 hrs | 30 hrs | 40 hrs |
| 120° C. | Bubbles present | Bubbles present | Bubbles present | Bubbles present | Bubbles present |
| 140° C. | Bubbles present | No defect | No defect | No defect | No defect |
| 160° C. | Bubbles present | No defect | No defect | No defect | No defect |
| 170° C. | Bubbles present | No defect | No defect | No defect | No defect |

Examination of Atmosphere of Pre-bake Treatment of Silicone Resin Sheet

In the above Examination of pre-bake conditions of silicone resin sheet, the atmosphere of the dryer during the pre-bake treatment was changed to air, and heat treatment was conducted under an ambient pressure of 1 atm at 170° C. for 30 hours. A glass bonded body and an Al bonded body were prepared under the same conditions as the above Examination of pre-bake conditions of silicone resin sheet except for the above, and were evaluated by the evaluation test described above. According to the results, there were no bubbles at the bonded interface of the glass bonded body, and a change in the thermal conductivity of the Al bonded body was 3%.

Furthermore, in the above Examination of pre-bake conditions of silicone resin sheet, the atmosphere of the dryer during the pre-bake treatment was changed to nitrogen gas, and heat treatment was conducted under a nitrogen atmosphere of 1 atm at 170° C. for 15 hours. A glass bonded body and an Al bonded body were prepared under the same conditions as the above Examination of pre-bake conditions of silicone resin sheet except for the above, and were evaluated by the evaluation test described above. According to the results, there were no bubbles at the bonded interface of the glass bonded body, and a change in the thermal conductivity of the Al bonded body was 3%. Note that, also in the case where argon was used instead of nitrogen, the same results as in the case of nitrogen were obtained.

According to the above results, the atmosphere of the pre-bake treatment may be air, nitrogen, or argon at 1 atm, and the pre-bake treatment is more preferably conducted in a vacuum in order to further decrease the change in the thermal conductivity.

This application claims the priority of U.S. Provisional Application No. 61/154,000 filed on Feb. 20, 2009, the contents of which is hereby incorporated by reference herein in its entirety.

INDUSTRIAL APPLICABILITY

The present invention is applicable as, for example, an electrostatic chuck.

What is claimed is:
1. A method of producing a ceramic-metal bonded body by bonding a ceramic plate to a metal supporting base with a bonding sheet containing a resin as a main component, the method comprising:
a pre-bake step of heating the bonding sheet in a vacuum in advance to reduce the amount of volatile components in the bonding sheet; and
a bonding step of bonding the plate to the supporting base with the bonding sheet therebetween by placing the plate, the supporting base, and the bonding sheet in an airtight bag, reducing pressure in the airtight bag, and performing heating at a temperature lower than that of the pre-bake step while applying a pressure in an autoclave.

2. The method of producing a ceramic-metal bonded body according to claim 1, wherein, in the pre-bake step, the bonding sheet is applied onto the supporting base, and the supporting base to which the bonding sheet is applied is heated to reduce the amount of volatile components in the bonding sheet.

3. The method of producing a ceramic-metal bonded body according to claim 1, wherein, in the pre-bake step, the bonding sheet is applied onto the plate, and the plate to which the bonding sheet is applied is heated to reduce the amount of volatile components in the bonding sheet.

4. The method of producing a ceramic-metal bonded body according to claim 1, wherein, in the pre-bake step, a frame which is a board having an opening having the same shape as the bonding sheet of the ceramic-metal bonded body and a large-size sheet which is formed into the bonding sheet are prepared, the large-size sheet is applied onto the frame so that the large-size sheet covers the opening of the frame, and the frame to which the large-size sheet is applied is heated to reduce the amount of volatile components in the large-size sheet.

5. The method of producing a ceramic-metal bonded body according to claim 2, wherein the resin is an acrylic resin, and heating conditions in the pre-bake step are 15 to 30 hours at 2,000 Pa or less at 120° C. to 130° C.

6. The method of producing a ceramic-metal bonded body according to claim 2, wherein the resin is a silicone resin, and heating conditions in the pre-bake step are 15 to 30 hours at 2,000 Pa or less at 140° C. to 170° C.

7. The method of producing a ceramic-metal bonded body according to claim 1, wherein the ceramic-metal bonded body is an electrostatic chuck used for fixing a wafer by applying suction in a semiconductor manufacturing process or a showerhead used for supplying and dispersing a reactant gas to a chamber in a semiconductor manufacturing process.

8. The method of producing a ceramic-metal bonded body according to claim 3, wherein the resin is an acrylic resin, and heating conditions in the pre-bake step are 15 to 30 hours at 2,000 Pa or less at 120° C. to 130° C.

9. The method of producing a ceramic-metal bonded body according to claim 3, wherein the resin is a silicone resin, and heating conditions in the pre-bake step are 15 to 30 hours at 2,000 Pa or less at 140° C. to 170° C.

10. The method of producing a ceramic-metal bonded body according to claim 4, wherein the resin is an acrylic resin, and heating conditions in the pre-bake step are 15 to 30 hours at 2,000 Pa or less at 120° C. to 130° C.

11. The method of producing a ceramic-metal bonded body according to claim 4, wherein the resin is a silicone resin, and heating conditions in the pre-bake step are 15 to 30 hours at 2,000 Pa or less at 140° C. to 170° C.

* * * * *